United States Patent [19]
Pearce

[11] Patent Number: 5,654,657
[45] Date of Patent: Aug. 5, 1997

[54] ACCURATE ALIGNMENT OF CLOCKS IN MIXED-SIGNAL TESTER

[75] Inventor: Stuart Robert Pearce, San Jose, Calif.

[73] Assignee: Schlumberger Technologies Inc., San Jose, Calif.

[21] Appl. No.: 510,395

[22] Filed: Aug. 1, 1995

[51] Int. Cl.$^6$ .................................................. H03L 7/00
[52] U.S. Cl. ..................... 327/163; 327/149; 327/150; 327/234; 327/296
[58] Field of Search ........................... 327/147, 149–50, 327/153, 163, 233–4, 296

[56] References Cited

U.S. PATENT DOCUMENTS 4,560,939  12/1985  DeKarske et al. ................ 327/296

*Primary Examiner*—Margaret Rose Wambach
*Attorney, Agent, or Firm*—Bruce D. Riter

[57] ABSTRACT

Asynchronously-generated digital and analog clocks in a mixed-signal test system are accurately aligned for repeatable and deterministic testing. A variable-frequency digital master clock signal is used in direct digital synthesis of an analog clock signal which is asynchronous to the master clock signal. A resync command inhibits the analog clock signal until the analog clock signal is in a desired phase relationship to the master clock signal. The analog clock signal is thus phase-aligned with the master clock signal in a known and deterministic relationship. The resync command also aligns the phase of the analog clock signal with the pattern of stimulus signals applied to the device under test. Aligning the analog clock signal with the master clock signal and with the stimulus pattern assures that test results are consistent from test-to-test. A phase-locked loop removes spurs from the synthesized analog clock signal. A jitter generator is provided for controlled jittering of the analog clock signal as needed for some types of test. An Nth occurrence counter allows for programmable introduction of an extra master-clock signal period in the test pattern when needed to avoid creating a metastable condition in the device under test.

14 Claims, 7 Drawing Sheets

ACCURATE ALIGNMENT OF CLOCKS IN MIXED-SIGNAL TESTER

BACKGROUND OF THE INVENTION

1. Field of the Invention

The present invention relates to methods and apparatus for accurate alignment clock signals, particularly of clock signals in a mixed-signal integrated circuit tester.

2. The Prior Art

Digital integrated circuit (IC) devices are typically tested by applying to pins of the device a pattern of binary stimulus signals in pre-determined patterns and timing relationships. The digital test system looks at the resulting digital output signals of the device and compares them to a pre-defined truth table. A pass or fail decision results, depending on whether the bits (1's and 0's) at the device's output pins match the bits of the truth table during each time interval. Test systems for such devices are flexible and programmable to suit the requirements of the type of device to be tested. An example of a high-speed, programmable digital test system is the ITS 9000FX system commercially available from Schlumberger Technologies, San Jose, Calif.

Other devices to be tested are not purely digital. These devices, known as "mixed-signal" devices, can have both digital and analog signal characteristics. Mixed signal devices often are mostly digital, but cannot be tested as purely digital devices are tested. Mixed signal devices can have pins which require one or more analog signal inputs (e.g., analog-to-digital converters (ADC's)) or one or more analog signal outputs (e.g., digital-to-analog converters (DAC's)) in addition to digital-signal inputs or outputs. Mixed signal devices can have pins which receive or supply digital representations of analog signals (e.g., coder-decoder devices (codecs)).

In a system for testing of purely digital devices, a single master clock is used to synchronize all activities of the tester, such as controlling the event logic which is used to drive pins of a device under test (DUT) and to measure response on pins of the DUT. The ITS 9000FX test system, for example, has a system master clock at a fixed frequency of 312.5 MHz. All activities at the test head are time-aligned based on frequency, known-length periods and fixed-delay lines. Because all is synchronized to a single master clock, the results are repeatable within the accuracy of the system each time a given test is run.

In a mixed-signal test system, each analog channel must have its own clock source which operates asynchronously relative to the system master clock driving the DUT's digital pins. To address mixed-signal testing requirements, fine control over clock frequency is required. The analog-channel clock source must also be deterministic, i.e., the same test results must be obtained each time a given test program is run on the DUT. This means that the phase between an analog-channel clock and the system master clock must be the same each time the test program is run, even though these clocks are operating asynchronously to one another.

FIG. 1 illustrates the need for two "master" clocks in mixed-signal testing. A master clock 100 supplies a clock signal to a frequency divider 105 which in turn supplies a reduced-frequency signal to a sequencer 110. Sequencer 110 supplies a clock signal to the clock input 115 and data bits to a data input 120 of a DUT 125. In the example, DUT 125 is a digital-to-analog converter (DAC) which supplies at an output 130 line an analog signal 135. The test system passes the analog signal through a buffer 140 to a digital-to-analog converter (ADC) 145. To sample the analog signal, ADC 145 needs a clock signal at its clock input 150. A problem arises in that, if the DAC data rate is 100 MHz, traditional sampling would require an unrealistically-high, 200 MHz sampling rate (Nyquist).

One solution is to employ the well-known technique of undersampling, in which the signal is sampled at a lower rate and re-sampled at varying phase relationships to the test pattern as the test pattern is repeatedly applied to the DUT. If undersampling were used in this example to measure 4096 points in 10 nanoseconds (ns), the required clock to the sampler would have a period of 10.00244141 ns, or a frequency of 99,975,591.1 Hz. To derive the 100 M/-Hz clock signal for the DUT and a 99,975,591.1 MHz sampling-clock signal from a single master clock would require a master clock at an impractically-high frequency of 409.5 GHz.

Using two master clocks raises other problems. If two separate clocks are used, they must each have a high resolution (e.g., 0.1 Hz) to achieve a high effective sampling rate (e.g., 1 GHz). The clocks must be phase-locked to one another and, to assure repeatable and deterministic sampling, the phase relationship between the two clocks must not vary from test to test.

In one traditional approach to mixed-signal testing, a first clock supplies a clock-signal used to generate digital events and a second clock supplies a clock-signal for the analog instrument. The analog instrument is thus operating asynchronously to the digital events. Various techniques have been proposed for realigning the asynchronous clock signals, but there is always a remanent error of at least one clock cycle. Testing is therefore not repeatable and deterministic.

Improved methods and apparatus are desired for generating clock signals used in mixed-signal testing.

SUMMARY OF THE INVENTION

In accordance with preferred embodiments of the invention, asynchronously-generated digital and analog clocks in a mixed-signal test system are accurately aligned for repeatable and deterministic testing. A variable-frequency digital master clock signal is used in direct digital synthesis of an analog clock signal which is asynchronous to the master clock signal. A resync command inhibits the analog clock signal until the analog clock signal is in a desired phase relationship to the master clock signal. The analog clock signal is thus phase-aligned with the master clock signal in a known and deterministic relationship. The resync command also aligns the phase of the analog clock signal with the pattern of stimulus signals applied to the device under test. Aligning the analog clock signal with the master clock signal and with the stimulus pattern assures that test results are consistent from test-to-test. A phase-locked loop removes spurs from the synthesized analog clock signal. A jitter generator is provided for controlled jittering of the analog clock signal as needed for some types of test. An Nth occurrence counter allows for programmable introduction of an extra master-clock-signal period in the test pattern when needed to avoid creating a metastable condition in the device under test.

These and other features of the invention are disclosed in more detail below with reference to the accompanying drawing figures.

DETAILED DESCRIPTION

Figure 1:
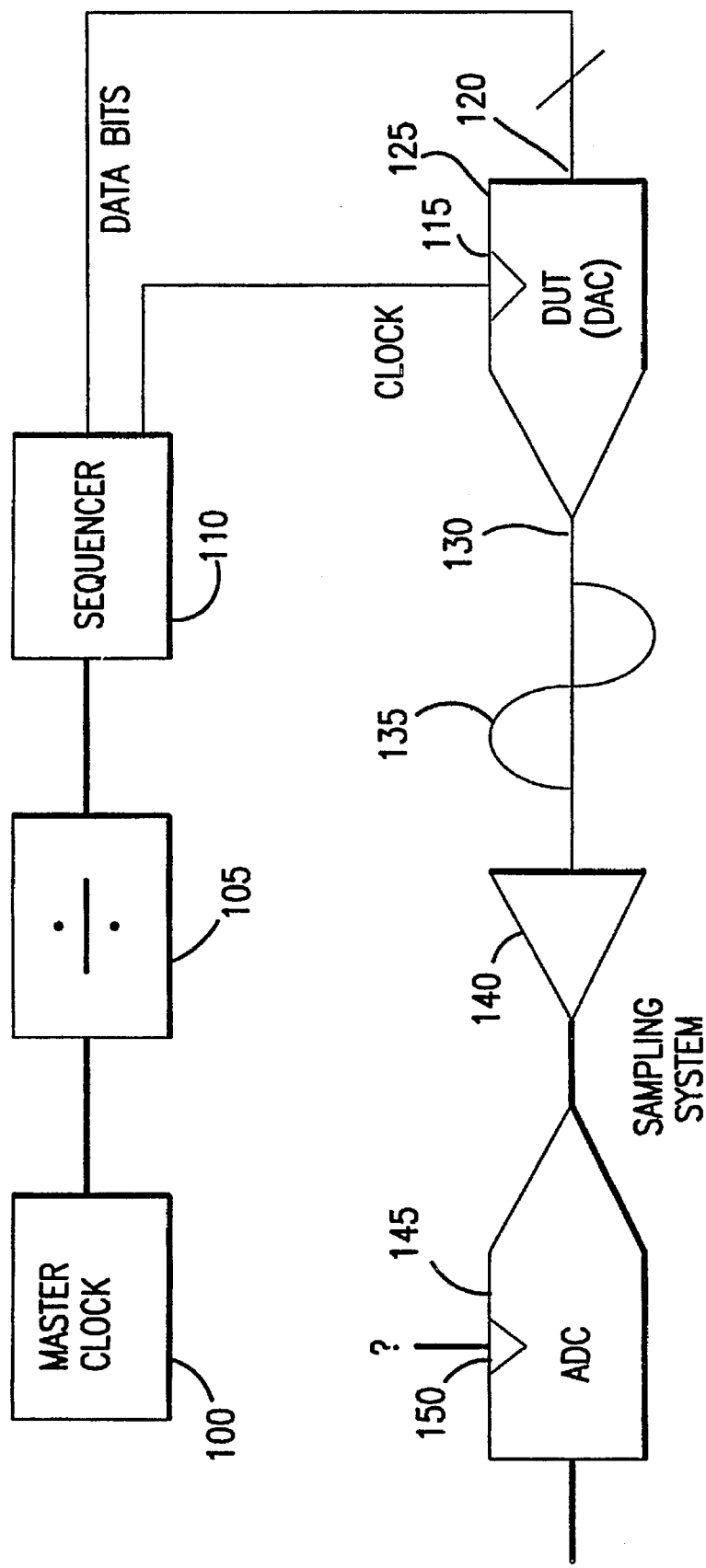
FIG. 1 shows an example of the need for two "master" clocks in mixed-signal testing.
Figure 2:
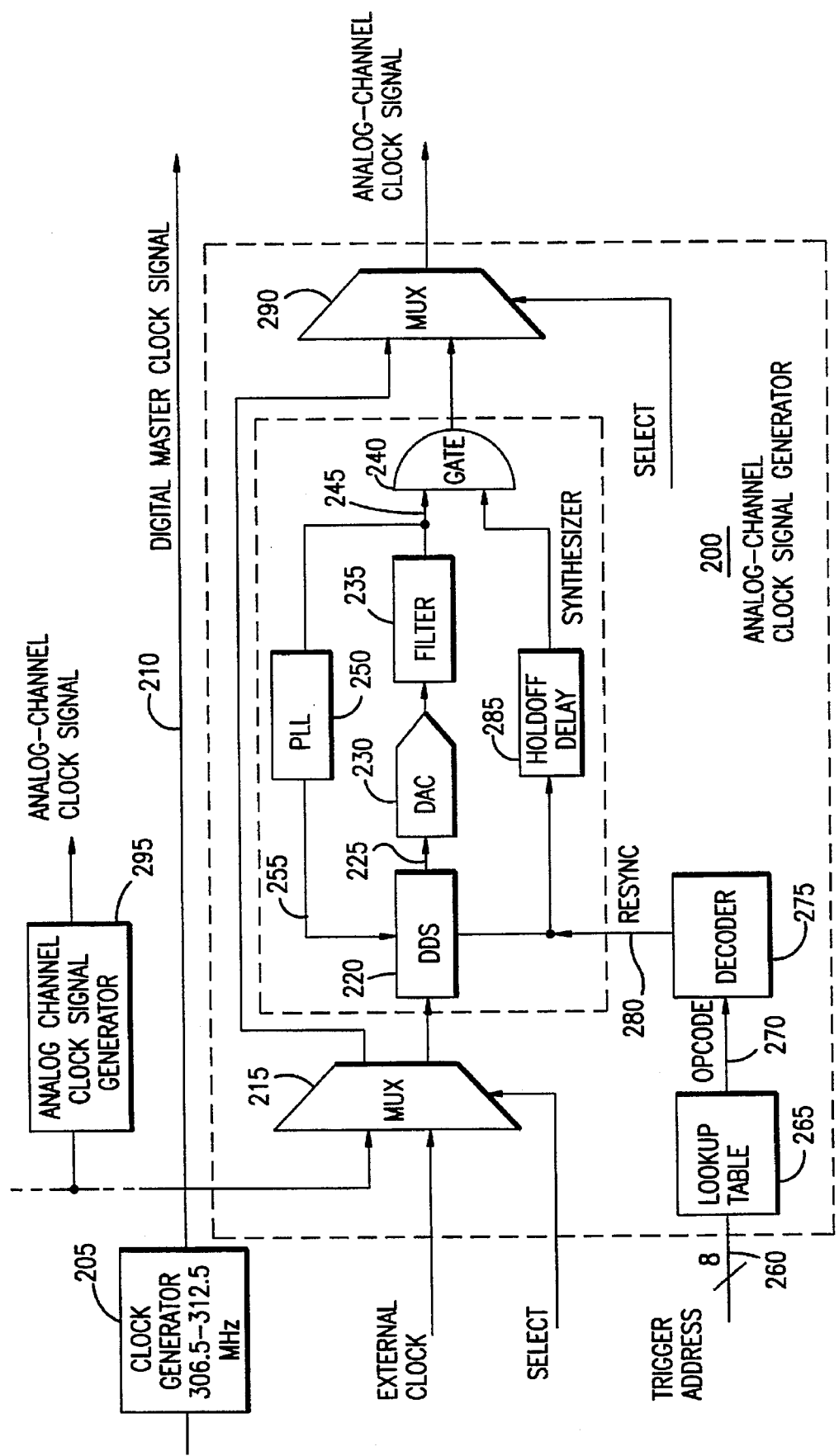
FIG. 2 shows an arrangement in accordance with the invention for asynchronously generating a digital master clock signal and an analog clock signal which can be synchronized on command.

FIG. 2 shows an arrangement for asynchronously generating a digital master clock signal and an analog clock signal in which the two signals can be resynchronized on command so that the relationship between the clock signals is deterministic. Because of the need for oversampling, e.g., in a mixed-signal tester, provision is made for altering the phase of the analog clock signal relative to that of the digital master clock signal.

The arrangement makes use of a variable-frequency master clock-signal generator 205 which supplies a digital master clock signal on line 210 for use in the digital subsystem and to a multiplexer (mux) 215 of an analog clock signal generator 200. Mux 215 passes the master clock signal to a first input line of direct digital synthesizer (DDS) 220. DDS 220 generates on line 225 a digital signal representing an analog waveform. The phase of the signal on line 225 is fixed by DDS 220 relative to the phase of the master clock signal. The signal on line 225 is fed to a digital-to-analog converter 230 which supplies an analog clock signal through filter 235 to one input of a gate 240 on line 245.

A difficulty with direct digital synthesis is that the purity of the resulting analog clock signal is sometimes not high enough due to signal spurs. To remove the spurs, the analog clock signal on line 245 is preferably fed back through a phase-locked loop (PLL) 250 to a second input of DDS 220 on line 255. With the PLL feedback, the analog signal on line 245 is free of spurs. It is also in a deterministic and known phase relationship to the digital master clock signal.

However, the exact phase relationship between the analog signal and the operating state of a device under test (DUT) is not known at power-up of master clock generator 205. The ability to resynchronize the analog signal to a DUT is therefore provided by a resync subsystem. A trigger address signal (e.g., an 8-bit Enable Instrument or "EINST" code) is supplied on line 260 to a lookup table 265 which provides a corresponding opcode signal on line 270 to a decoder 275. Decoder 275 decodes the opcode signal and supplies a "resync" signal on line 280 to a third input of DDS 220 and via a holdoff delay 285 to a second input of gate 240. The resync signal causes DDS 220 to hold-off-generation of clock data on line 225 until enabled by the resync signal. Holdoff delay 285 allows the resync signal to open gate 240 and pass the analog clock signal to multiplexer (mux) 280 after a suitable interval which allows the analog signal to stabilize before being supplied to mux 290.

Muxes 215 and 290 are optional and are controllable by means of "select" signals on respective control inputs so that an external clock can be used as an input to DDS 220 or passed through to the output of mux 290 if desired. Clock signal generator 200 provides a clock signal for use in a first analog channel of a mixed signal test system, for example. Such clock signal generators can be provided for additional analog channels, as indicated for example by analog-channel clock signal generator 295.

Use of a DDS provides a mechanism for phase of the analog-subsystem clock signal to be in a deterministic and repeatable relationship to the phase of the digital master clock signal. The resync subsystem allows the analog signal generation to be synchronized with activity of the DUT, e.g., to be synchronized with a pattern of vectors being applied to exercised the DUT. To provide for oversampling a signal from the DUT, provision is made to alter the phase of the analog-subsystem clock signal relative to that of the master clock signal. When resynchronized, the analog clock is fully deterministic because it is time-aligned with the digital clock and with the DUT.

Figure 3:
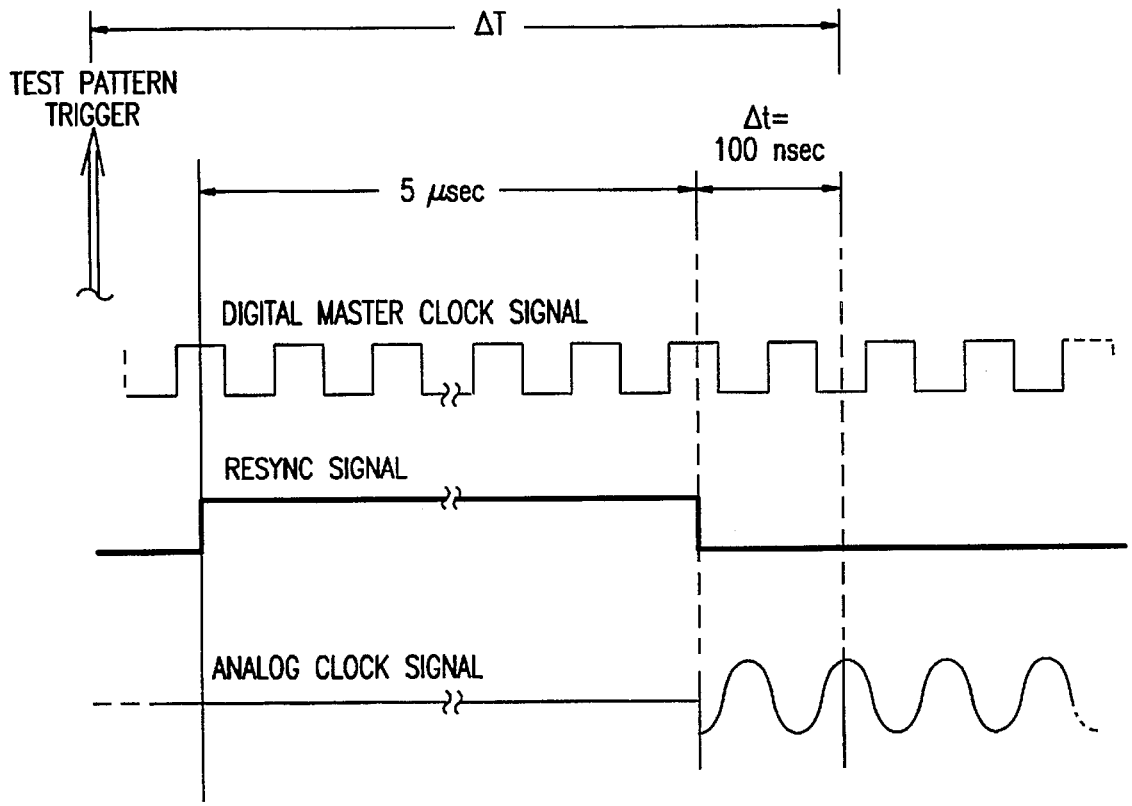
FIG. 3 illustrates synchronization of the clock signals in the arrangement of FIG. 2.

FIG. 3 illustrates synchronization of the analog clock signal. The digital master clock signal is running continuously. The resync signal holds off production of the analog clock signal for some interval, such as 5 μsec. When enabled by the resync signal, generation of the analog clock signal commences. At any given time Δt, e.g., 100 nanosec, after the analog clock signal commences, the analog clock signal is in a known and fully determined phase relationship to the digital master clock signal. The analog clock signal is also in a known and fully determined phase relationship to the pattern of test vectors applied to the DUT, e.g., the analog signal is in a known and pre-determined phase at any given time ΔT following a test-pattern trigger defining the start of the test vector pattern. Signals applied to the DUT and captured from the DUT during test are always in a defined relationship, so that the test and the test result will be the same each time the test is run, within the resolution and accuracy of the test system. Each time the test is started, a resync signal is issued to hold off the generation of the analog clock signal until everything is phase-aligned in the analog clock generation circuitry. When analog clock signal generation is enabled, the analog clock signal is produced in exactly the same manner. Once aligned, the phase of the analog clock signal relative to the digital master clock signal can be predicted for any point in time following the resync signal. This eliminates phase uncertainty between the digital and the analog subsystems of the mixed-signal tester, and provides for test-to-test repeatability for coherent mixed-signal testing. If, during a test, the test system loses track of the phase relationship, the test system can issue a further resync signal to realign the analog and digital clock signals.

The system master clock in the ITS 9000FX digital tester is fixed at 312.5 MHz (3.2 nsec periods), which is acceptable for time-based testing. For mixed-signal testing, however, finer control over clock frequency is required. High-accuracy clock signals are need to meet analog or mixed-signal testing standards, such as the IEEE CCITT standard. A resolution which is acceptable for time-domain (e.g., digital) testing is unacceptable for frequency-domain (e.g., mixed-signal) testing. The master digital clock signal generator is therefore preferably variable, e.g., covering a range of 312.5+0/−6 MHz in 0.5 MHz steps.

Using a 32-bit DDS to provide a programmable digital master clock frequency with a resolution of about 100 ps, the clock period would be variable from 3.2 ns to about 3.3 ns. With the fixed-clock-frequency digital tester, three clock cycles =3×3.2 ns=9.6 ns. The period of the next possible step would be +100 ps or 9.61 ns. Because of the rather large steps by which the master clock signal period can vary, e.g., by 100 ps, and because the digital master clock signal is divided down, the timing resolution of the analog clock signal which can be produced is limited, e.g., to 12.5 ps.

Accordingly, the master clock signal generator preferably uses a DDS and PLL and mixer(s) to provide for a programmable clock frequency, e.g., within the range of 306–312.5 MHz. By altering frequency of the master clock signal generator a small amount, so it is varying between 312.5 and, e.g., 312 MHz, the clock signal can be altered to produce an analog clock signal of exactly the frequency needed, e.g., having a period of exactly 9.601 ns.

Figure 4:
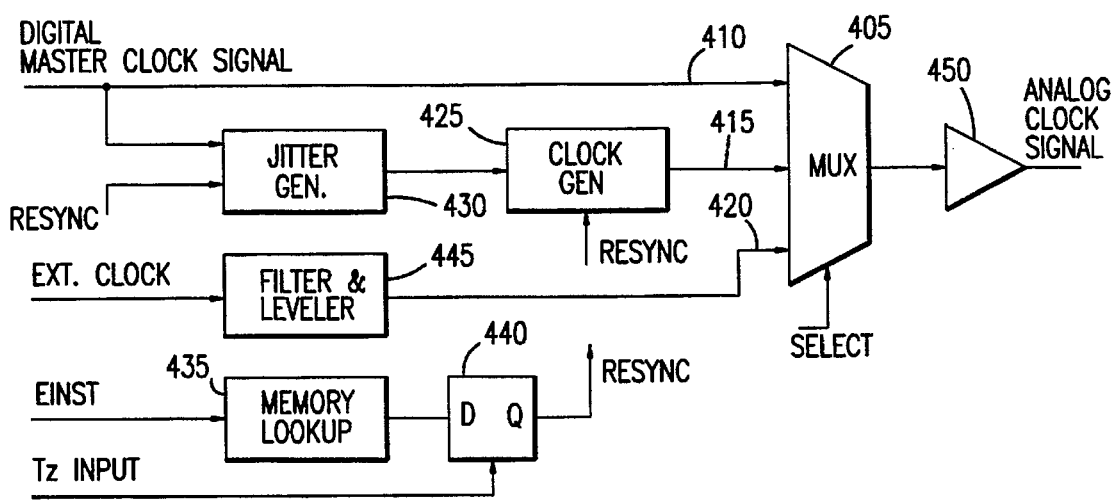
FIG. 4 shows another embodiment of an analog-channel clock signal generator in accordance with the invention.

FIG. 4 shows another embodiment of an analog-channel clock signal generator 200. A mux 405 selects one of three clock sources: the digital master clock signal on line 410, an analog clock signal generator with a controllable output of 125–250 MHz on line 415, and an external clock source on line 420. The analog clock signal generator 425 is coupled to an optional jitter source 430 useful, for example, for phase-lock testing of mixed-signal devices with specifications per CCITT requirements. The trigger address ("EINST") code is decoded in a memory and fed to an input line of a trigger circuit 440. Trigger circuit 440 also receives a test-pattern trigger (Tz) input signal which enables the resync signal at the appropriate time relative to the test pattern applied to the DUT. As indicated in FIG. 3, the resync signal disables the analog clock signal from clock generator 425 until the analog clock signal is established at the proper phase relative to the digital master clock signal and to the test pattern applied to the DUT. The external clock signal is passed to line 420 via a filter & leveler circuit 445. The signal out from mux 405 is supplied to one or more output buffers 450.

Figure 5:
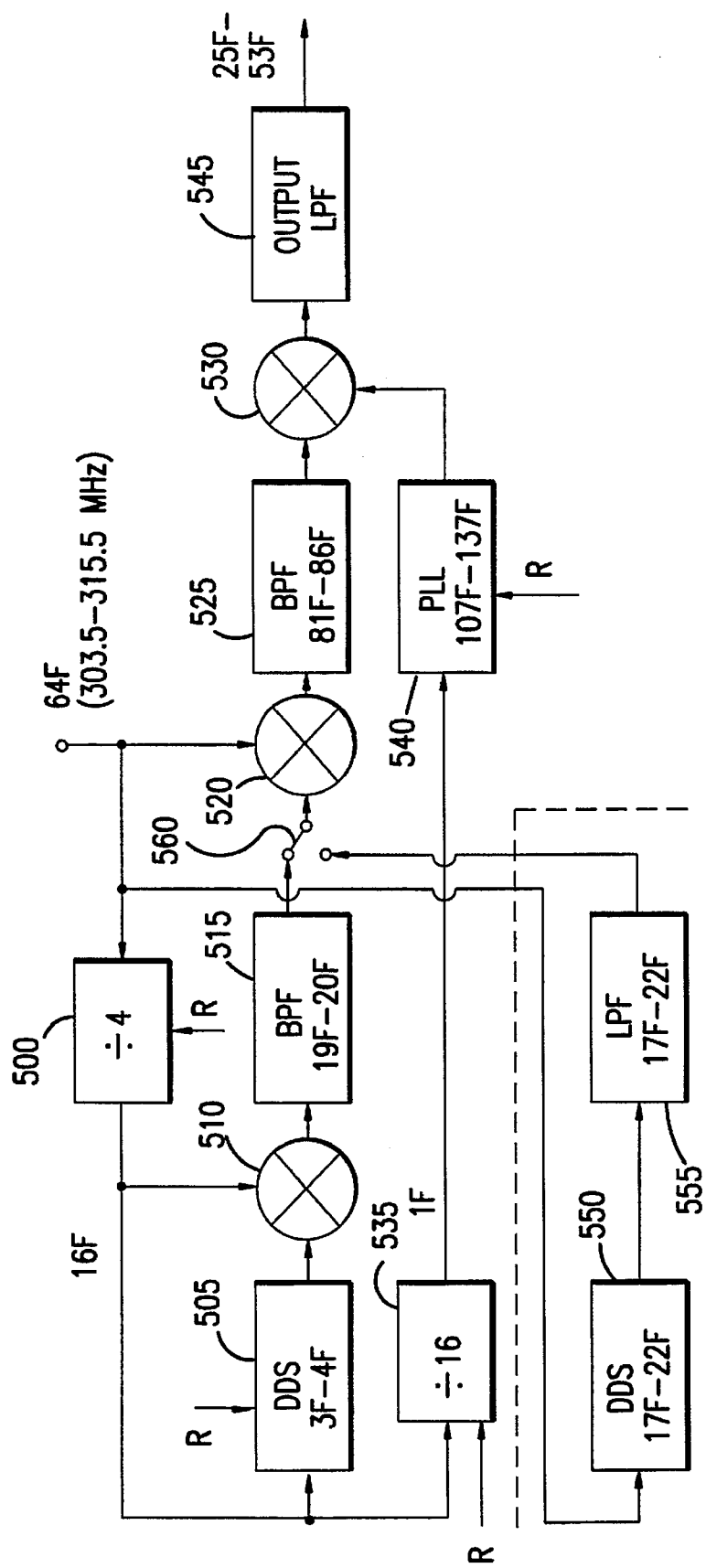
FIG. 5 is a block diagram of a clock generator in accordance with the invention for generating a low-jitter analog clock signal.

FIG. 5 is a block diagram of an embodiment of a clock generator 425 suitable for generating a low-jitter analog clock signal, e.g., of 125–250 MHz. The master clock signal of about 313.5 MHz (64F) is divided by 4 in a divider 500 and the resulting signal of about 78 MHz (1 6F) is supplied to a DDS 505 and to a mixer 510. Signal generation starts by generating a sine wave at approximately 20 MHz over a band of about 5 MHz (3F to 4F, where F≈4.9 MHz) using DDS 505. The sine wave is mixed with the 16F signal from divider 500 in mixer 510 to produce a first intermediate frequency signal of about 93–98 MHz (19F–20F), and filtered in a band-pass filter (BPF) 515. The filtered first-intermediate frequency signal 19F–20F is mixed with the master clock signal 64F in a mixer 520. The resulting second-intermediate frequency signal of about 400 MHz (81F–86F) is filtered in a band-pass filter 525 and supplied to mixer 530. The 16F signal from divider 500 is divided-down to 1F in a divider 535 and supplied to phase-locked-loop (PLL) 540. PLL generates a signal of 107F–137F which is mixed down with the second intermediate frequency signal to 125–250 MHz (25F–53F) in mixer 530. The analog clock signal is supplied at an output line through an output low-pass filter 545. PLL 540 preferably has steps of ≈5 MHz (1F) to provide continuous coverage over the 125–250 MHz range. BPF 515 is preferably of inductor-capacitor (LC) construction, while BPF 525 is preferably a helical filter. Output LPF 545 is preferably of a simple discrete design. The phase-reset (resync) signal "R" is applied to DDS 505, to divider-by-four 500, to divider-by-sixteen 535, and to PLL 540. A deboggle circuit is used to set the feedback of PLL 540, e.g., as in the embodiment of FIG. 7. The filters must be wide enough to pass the modulated DDS signal.

Also shown in FIG. 5 is second DDS 550 which received the digital master clock signal (64F) and generates a wide-band jitter signal of about 83–108 MHz (17F–22F). The jitter signal is passed through a low-pass filter (LPF) 555 and supplied to a switch 560. Switch 560 allows selection of the unjittered first-intermediate frequency signal from BPF 515 or of the jitter signal from LPF 555, depending on whether jitter is required for a given test.

Figure 6:
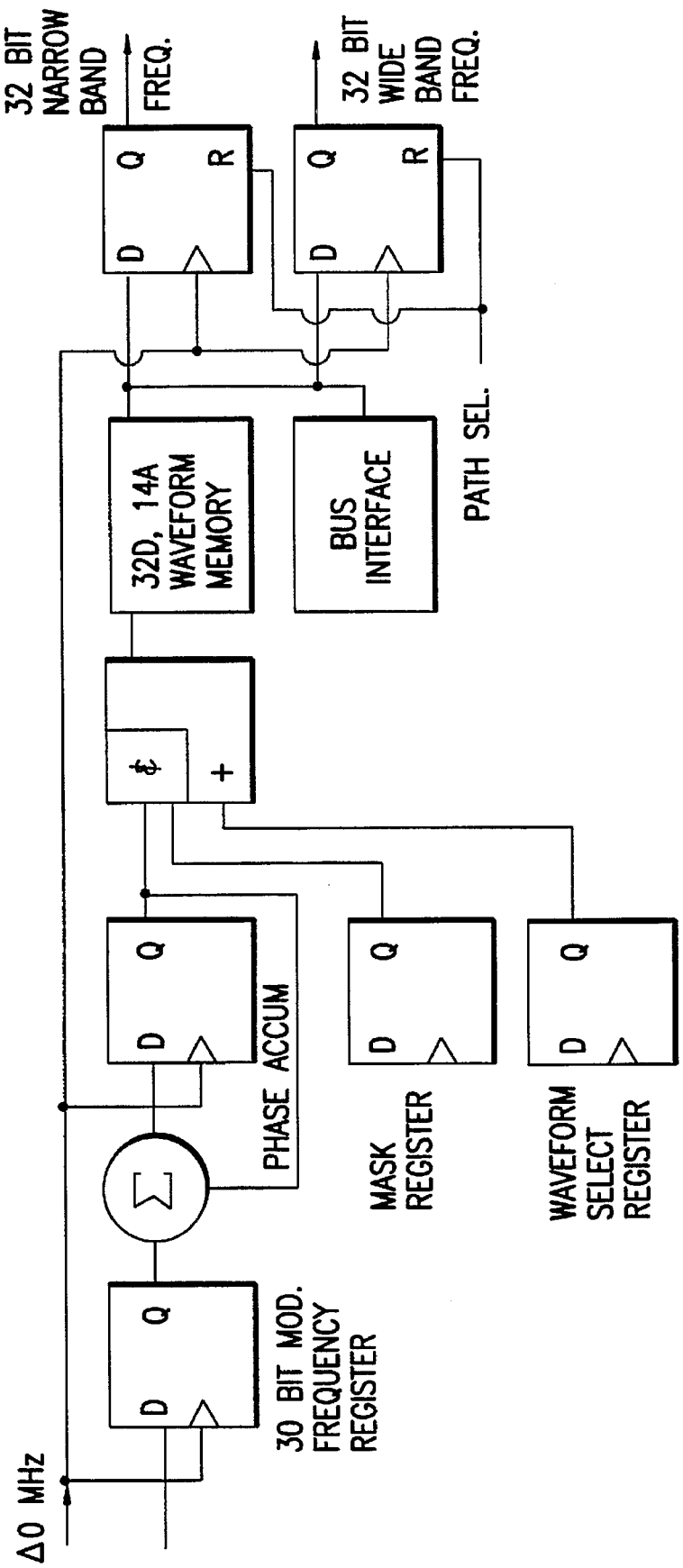
FIG. 6 shows an analog-clock-signal jitter generator in accordance with the invention.

FIG. 6 shows a jitter generator for applying jitter to the analog clock signal in the form of a single sine or square wave frequency modulation. The jitter waveform is stored in memory. ADDS is driven by a 40 MHz (≈8F) clock signal, e.g., from clock generator 425, resulting is a phase argument θ. Argument θ is used to access a random-access memory for the waveform, which is then applied to the clock generator, e.g., to clock generator 425 as a frequency. The waveform memory is preferably a lookup table. The information in memory is a function of the amplitude of the sine, that is, the frequency deviation. Memory is designed so that multiple sine functions can be stored in memory with a register to index between them, avoiding the need to reload memory. The phase reset ("resync") signal also resets these functions. Non-sinusoidal waveforms have a restriction on $\Delta\theta/\Delta z$ so as not to have a remainder.

Figure 7:
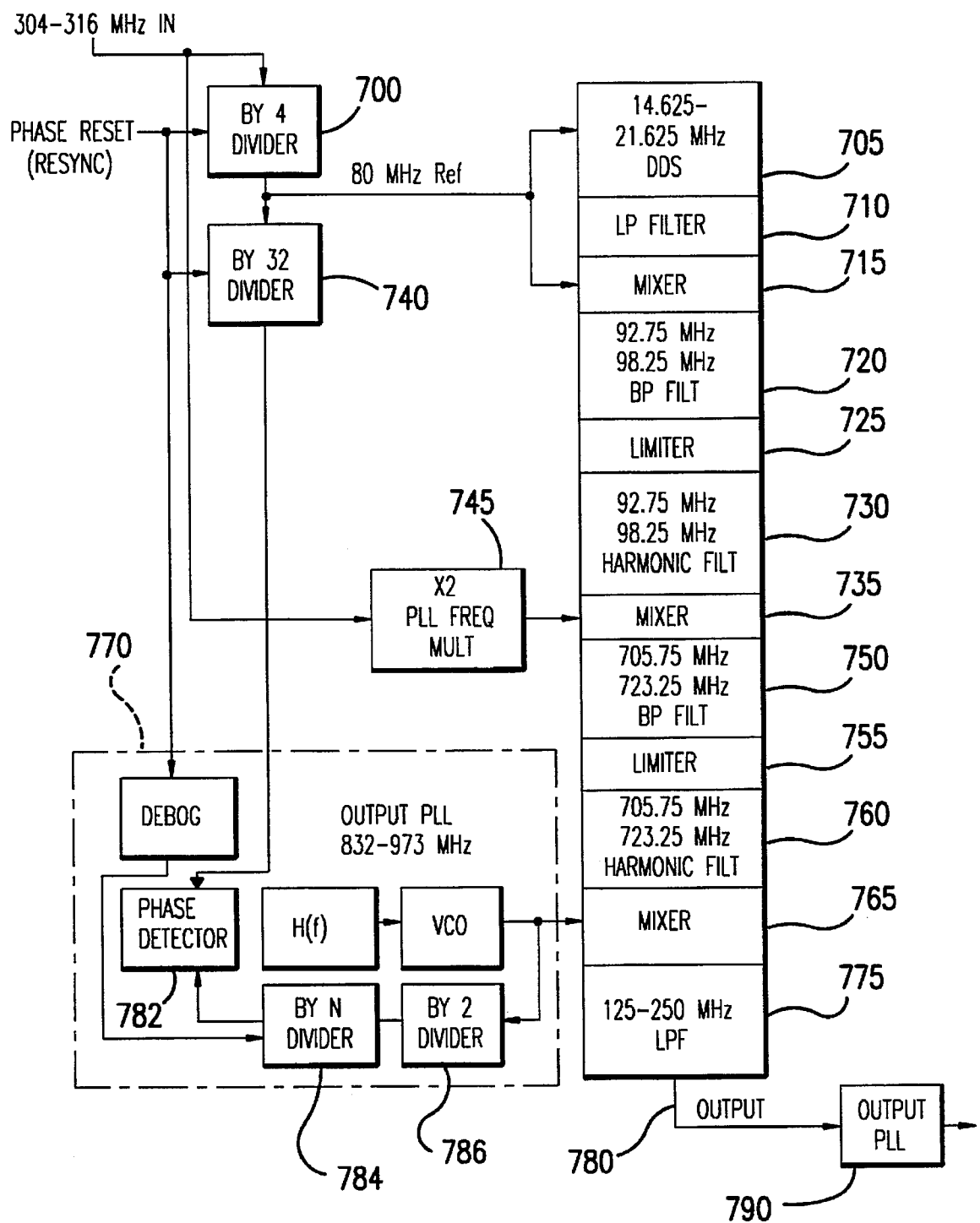
FIG. 7 shows a variation of the analog clock generator of FIG. 5.

FIG. 7 shows a variation of the analog clock generator of FIG. 5. A digital master clock signal of 304–316 MHz is supplied to a divider-by-four 700. Divider 700 supplies a reference signal of about 80 MHz to a DDS 705 and to a mixer 715. DDS 705 generates a 14.625–21.625 MHz signal through LPF 710 to mixer 715. Mixer 715 supplies a 92.75–98.25 MHz signal through BPF 720, limiter 725 and harmonic filter 730 to mixer 735. The digital master clock signal is doubled in a PLL frequency multiplier 745 and the result is mixed with the output from harmonic filter 730 in mixer 735. The resulting 705.75–723.25 MHz signal is passed through BPF 750, limiter 755 and harmonic filter 760 to a mixer 765. The reference signal from divider 700 is fed to a divider-by-32 740 which supplies the resulting signal to output PLL 770. Output PLL 770 produces a signal of 832–973 MHz to mixer 765. Mixer 765 supplies the 125–250 MHz analog clock signal through LPF 775 to an output line 780. An optional final PLL 790 can be used to eliminate spurs which are widely removed in frequency from the output frequency; this improves the event-to-event timing accuracy for clock events which are close to one another in time (e.g., the edge-to-edge relationship of adjacent clock events is more tightly controlled).

The minimum requirement to reset the clock-generator phasing is to reset the DDS phase accumulator and divider-by-four 700 and divider-by-32 740. This is done by issuing a reset to the DDS and jamming a count into the dividers in a fixed relationship relative to the resync pulse. Doing this will reset the output phase eventually. However, a problem develops with output PLL 770. A resync pulse can arrive at any time relative to the phase of phase detector 782 of output PLL 770. The recovery of PLL 770, like that of any deboggle circuit, is a stochastic process. Some time is required to resolve the metastability in the PLL, depending upon the loop bandwidth and the phase of the arrival of the resync pulse. Increasing the loop bandwidth would force a design trade-off of using a wider range DDS, which has a higher spurs level. The problem is resolved by carefully jamming dividers 700 and 740 as well as PLL feedback dividers 784 and 786. It is noted that the system is in phase lock before the arrival of a resync pulse.

When a resync pulse arrives, phase detector 782 is forced to the OFF state. Next, reference dividers 700 and 740 and feedback dividers 784 and 786 are jammed to a full phase detector period. Then phase detector 782 is released. When both counters generate their first clocks to the phase detector they are aligned to roughly 20 ns. The loop is in frequency lock and only needs to resolve roughly 20 ns of misalignment. This is done during the remaining 10 μs. The loop recovery is deterministic. Resetting the phase of the clock generator takes approximately 10 μs. During this time the output analog-clock signal is shut off by a timer, not shown in FIG. 7 (e.g., by a holdoff delay 285 and gate 240 as in FIG. 2).

Figure 8:
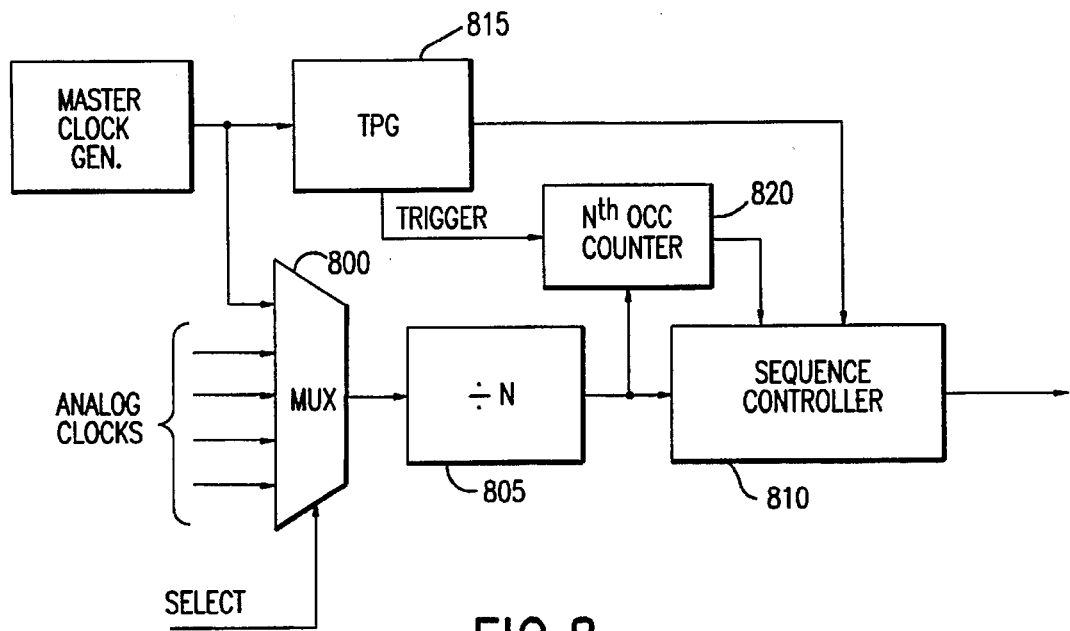
FIG. 8 shows a portion of the control circuitry for an analog source or measure sequencer in accordance with the invention.

The arrangements described above can be used in a mixed-signal test system having an analog source sequencer for generating analog signals to be applied to a DUT, and an analog measure sequencer for sequencing the capture of analog signals from a DUT. FIG. 8 shows a portion of the control circuitry for one of these sequencers. A mux 800 receives the system's digital master clock signal as well as the analog clock signals of one or more analog clock signal generators. One of the clock signals is selected and fed to a divider-by-N 805 which supplies the resulting clock signal to clock a sequencer controller 810. The master clock signal is also supplied to a test pattern generator (TPG) 815 which provides pattern sequence information to sequence controller 810 and a test-pattern trigger signal to an Nth occurrence counter 820. The test-pattern trigger signal typically occurs once per repetition of the test pattern. Nth occurrence counter 820 serves to insert one or more extra clock cycles in the pattern (e.g., in the analog waveform) applied to the DUT.

The digital part of a mixed-signal tester is clocked by the digital master clock signal which is also supplied to the DDS for analog clock generation. Because the digital and analog subsystems are resynchronized by aligning the clock signals as described herein, and because the DDS produces an output signal in a fixed mathematical relationship to the signal applied to the input of the DDS, the actual phase relationship between the digital master clock and the analog clock at any time following a reference event (such as the resync signal or the test pattern trigger signal) is predetermined and can be calculated and even displayed on a waveform display tool.

Figure 9:
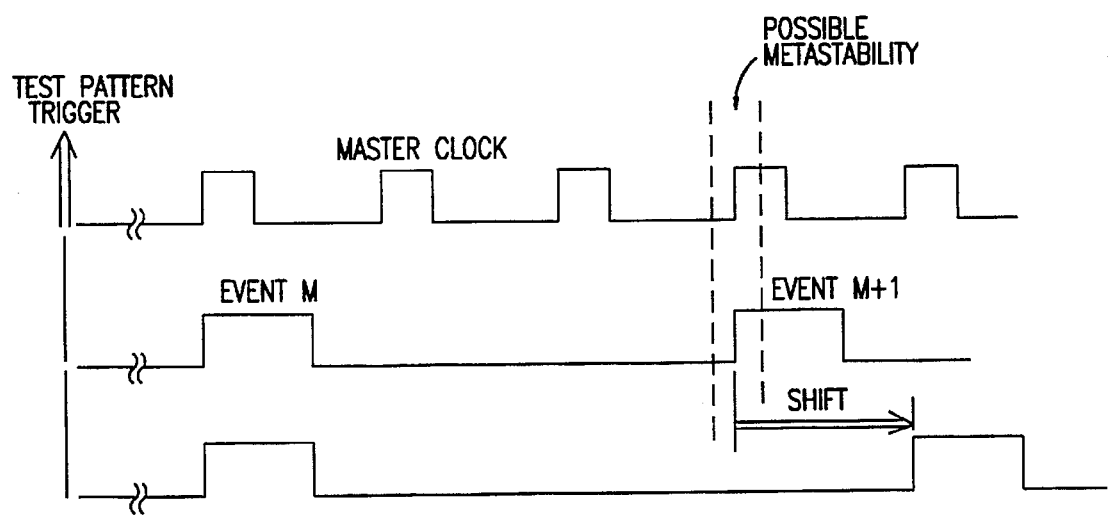
FIG. 9 shows how a clock period is inserted in the test pattern applied to a DUT to avoid a possible metastable condition in accordance with the invention.

FIG. 9 shows in the top line the test pattern trigger and the digital master clock. The center line shows a portion of a test pattern having an event M and an event M+1 relative to the test pattern trigger. It is sometimes possible in applying a test pattern to a DUT to induce an undesired condition within the DUT. Such a condition may be discovered in conducting a test, or may be predicted from knowledge of the applied test pattern and its phase relationship to the digital and analog clock signals. When required, the Nth occurrence counter can be programmed to insert a delay of one clock period between events M and M+1 of the test pattern. This time-shift changes the phase relationship between the test pattern and the analog clock signal to avoid the undesired condition. If required, a deterministic, delayed state can be produced by programming the Nth occurrence counter to introduce the desired delay.

Those skilled in the art will recognize description that numerous additional modifications may be made to the embodiments described above within the spirit and scope of the invention as defined by the claims below.

I claim:

1. A method of aligning the relative phase of asynchronous clock signals, comprising the steps of:

a. generating a master clock signal, b. generating by direct digital synthesis a second clock signal asynchronous with the master clock signal when enabled by a resynchronization signal; and c. producing said resynchronization signal which enables generation of the second clock signal such that the second clock signal is in a determined phase relationship to the master clock signal.

2. The method of claim 1, further comprising aligning the relative phase of the second clock signal to a test vector pattern in a mixed-signal tester by producing the resynchronization signal so as to enable generation of the second clock signal when the second clock signal is in a determined phase relationship to the test vector pattern.

3. The method of claim 1, wherein generating a master clock signal comprises generating a digital clock signal of variable frequency.

4. The method of claim 3, wherein generating a second clock signal comprises deriving the second clock signal by direct digital synthesis from the master clock signal so that frequency of the second clock signal varies with frequency variation in the master clock signal.

5. The method of claim 1, further comprising the step of gating the second clock signal to a clock-generator output such that the second clock signal is allowed to stabilize for an interval after being enabled by the resynchronization signal and is then passed to the clock-generator output after said interval.

6. The method of claim 2, wherein phase of the test vector pattern is indicated by a trigger, and further comprising the steps of counting a number N of clock events following the trigger and then inserting a programmed delay in the test vector pattern.

7. The method of claim 1, wherein the steps of generating the master clock signal, generating the second clock signal, and producing the resynchronization signal, are carried out in a mixed-signal integrated-circuit tester.

8. Apparatus for aligning the relative phase of asynchronous clock signals, comprising:

a. a master clock signal source;

b. a digital synthesizer for generating a second clock signal asynchronous with the master clock signal when enabled by a resynchronization signal; and c. a source of said resynchronization signal which enables generation of the second clock signal such that the second clock signal is in a determined phase relationship to the master clock signal.

9. The apparatus of claim 8, wherein the resynchronization signal further enables generation of the second clock signal relative to a test vector pattern in a mixed-signal tester when the second clock signal is in a determined phase relationship to the test vector pattern.

10. The apparatus of claim 8, wherein the master clock signal source is controllable for generating a digital clock signal at a selected frequency lying within a frequency range.

11. The apparatus of claim 10, wherein the digital synthesizer is responsive to the master clock signal for generating the second clock signal such that frequency of the second clock signal varies with frequency variation in the master clock signal.

12. The apparatus of claim 8, further comprising a gate for passing the second clock signal to a clock-generator output at a time interval after generation of the second clock signal is enabled by the resynchronization signal.

13. The apparatus of claim 8, wherein phase of a test vector pattern is indicated by a trigger signal, and further comprising a counter for counting a number N of clock events following the trigger and a sequencer responsive to the counter for inserting a programmed delay in the test vector pattern.

14. The apparatus of claim 8, wherein the master clock signal source, the digital synthesizer, and the source of said resynchronization signal, comprise elements of a mixed-signal integrated-circuit tester.

* * * * *